United States Patent
Lyford et al.

(10) Patent No.: US 6,636,054 B2
(45) Date of Patent: Oct. 21, 2003

(54) LOW CAPACITANCE PROBE CONTACT

(75) Inventors: J. Steve Lyford, Portland, OR (US); Mike A. Vilhauer, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/990,928

(22) Filed: Nov. 16, 2001

(65) Prior Publication Data

US 2003/0094960 A1 May 22, 2003

(51) Int. Cl.⁷ .......................... G01R 27/08; G01R 31/02
(52) U.S. Cl. ................ 324/715; 324/754; 324/757; 324/724
(58) Field of Search ................ 324/754, 757, 324/724, 715

(56) References Cited

U.S. PATENT DOCUMENTS

| | | | |
|---|---|---|---|
| 4,762,508 A | * 8/1988 | Tengler et al. | 439/607 |
| 6,023,171 A | * 2/2000 | Boyette et al. | 324/754 |
| 6,191,594 B1 | * 2/2001 | Nightingale et al. | 324/754 |
| 6,400,167 B1 | * 6/2002 | Gessford et al. | 324/754 |
| 6,538,458 B2 | * 3/2003 | Togashi et al. | 324/662 |

* cited by examiner

*Primary Examiner*—N. Le
*Assistant Examiner*—John Teresinski
(74) *Attorney, Agent, or Firm*—William K. Bucher

(57) ABSTRACT

A low capacitance probe contact has electrically conductive contacts having fingers with opposing interior flat surfaces forming a slit there between. The fingers extend in a first direction with a mounting member extending in the opposite direction having a flat surface that is parallel to the flat surfaces of the fingers. The first and second electrically conductive contacts are secured to respective first and second electrically conductive contact pads formed on a substrate with the flat surfaces of the mounting members being positioned on the contact pads. The substrate and the electrically conductive contacts are captured within a housing having first and second members. One member has a base and extending sidewalls forming a recess that receives the substrate and the electrically conductive contacts and the other member has a periphery coextensive with the first member to capture the substrate and the electrically conductive contacts therein.

7 Claims, 3 Drawing Sheets

LOW CAPACITANCE PROBE CONTACT

BACKGROUND OF THE INVENTION

The present invention relates generally to probing contacts and more particularly to a low capacitance probe contact.

Probing contacts used with logic analyzer and the like have parallel finger contacts that fit onto pins mounted on a circuit board having a fixed spacing between pins. The fingers have a flat portion on one end that are soldered to a substrate containing electrical circuitry that isolates the circuit under test from electrical loading by the measuring instrument. The flat portions are randomly oriented in relation to the fingers. Electrically conductive barrels are positioned over the finger contacts. The substrate and the barrels are overmolded with plastic with the barrels shielding the contact fingers from invasion by the overmolding plastic. The barrels force the circuit board mounted pins to enter the fingers in only one orientation and increase the overall diameter of the contact resulting in a higher capacitance between the contacts.

What is needed is a low capacitance probe contact for logic analyzers that overcomes the higher capacitance of parallel probe contacts housed in barrels. The probe contact should also allow for connection to pins having different center to center pin spacing and accept pins of different diameters.

SUMMARY OF THE INVENTION

Accordingly, the present invention is to a low capacitance probe contact having at least first and second electrically conductive contacts with fingers having opposing interior flat surfaces forming a slit there between. The fingers extend in a first direction with a mounting member extending in the opposite direction having a flat surface that is parallel to the flat surfaces of the fingers. The first and second electrically conductive contacts are secured to respective first and second electrically conductive contact pads formed on a substrate with the flat surfaces of the mounting members being positioned on the contact pads. The substrate and the first and second electrically conductive contacts are captured within a housing having first and second members. One of the members has a base and extending sidewalls forming a recess that receives the substrate and the first and second electrically conductive contacts. The other member has a periphery that is coextensive with the sidewalls and is secured to the sidewalls to capture the substrate and the first and second electrically conductive contacts within the housing.

In one embodiment, the first and second electrically conductive contacts are parallel to each other while in the preferred embodiment the contacts are inwardly angled such that the distal ends of the fingers are closer together than the mounting members secured to the substrate. The distal ends of the fingers are angled outward to facilitate the acceptance of pin contacts. The substrate has electrical circuitry mounted thereon having inputs electrically coupled to the first and second electrically conductive contact pads. The electrical circuitry minimizes electrical loading of signals under test coupled to the first and second electrically conductive contacts. Electrical leads are coupled to outputs of the electrical circuitry and extend from the housing. The space between the fingers of the first and second electrically conductive contacts has a substantially air dielectric insulator having a dielectric constant approximating the dielectric constant of air.

The objects, advantages and novel features of the present invention are apparent from the following detailed description when read in conjunction with appended claims and attached drawings.

BRIEF DESCRIPTION OF THE DRAWING FIGURES

DETAILED DESCRIPTION OF THE PREFERRED EMBODIMENT

Figure 1:
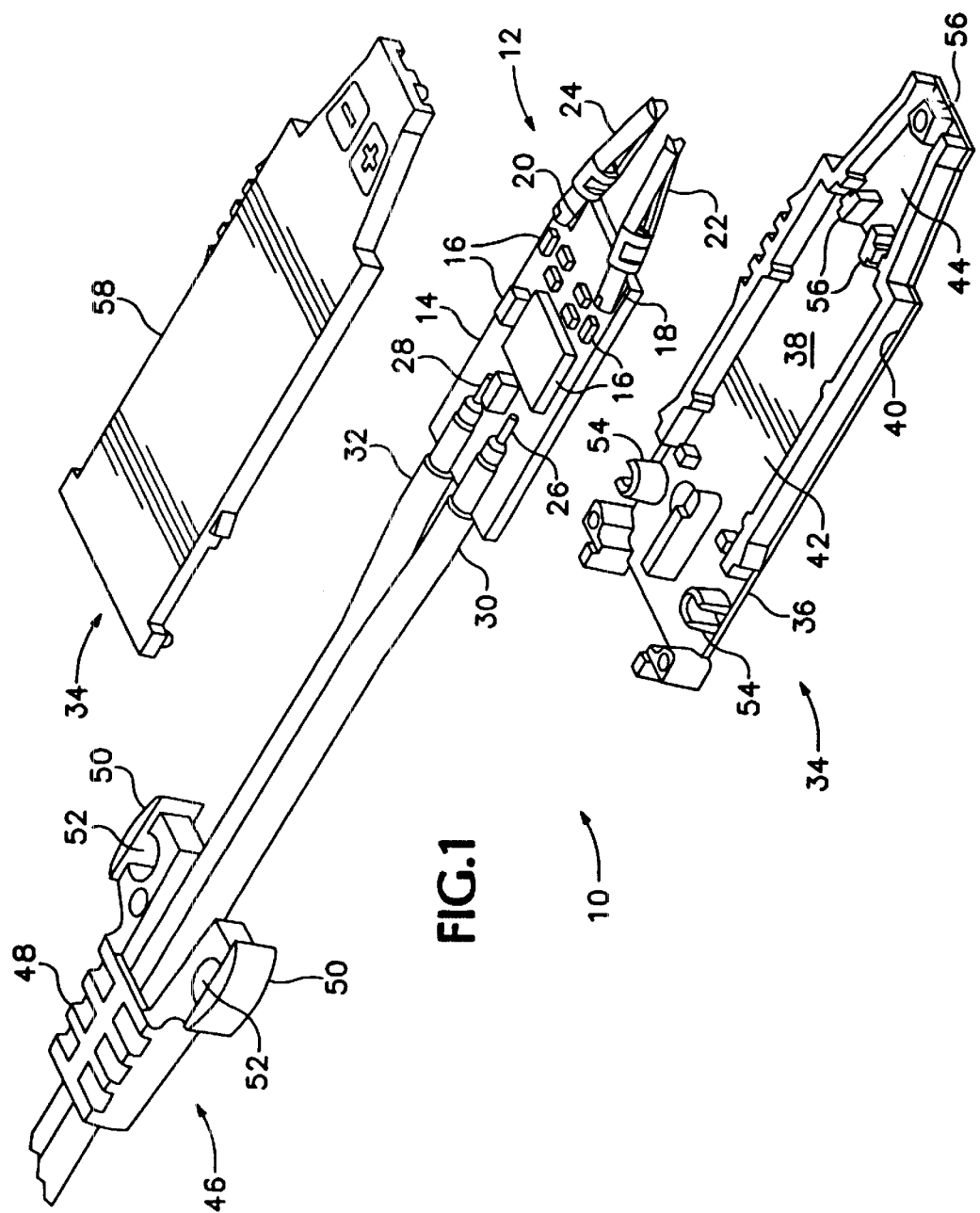
FIG. 1 is an exploded perspective view of a logic analyzer probe having the low capacitance probe contact accordingly to the present invention.

Referring to FIG. 1 there is shown an exploded perspective view of a logic analyzer probe 10 having the low capacitance probe contact 12 of the present invention. The logic analyzer probe 10 includes a substrate 14 having electrical circuitry formed thereon. The electrical circuitry includes passive and active components, represented by elements 16, and associated circuit runs (not shown) that minimize electrical loading of signals under test. Such circuitry is well known in the art. Input electrically conductive contact pads 18 and 20 are formed on the substrate 14 that are electrically coupled to inputs of the electrical circuitry. Electrically conductive contacts 22 and 24 are secured to the contact pads and extend from the substrate 14. Output electrically conductive pads 26 and 28 are formed on the substrate 14 that are electrically coupled to the outputs of the electrical circuitry. Electrical leads 30 and 32 are coupled to the output contact pads 26 and 28 for coupling the signal under test to a measurement test instrument, such as a logic analyzer or the like. In the preferred embodiment of the invention, the electrical leads 30 and 32 are coaxial cables. Alternately, coaxial contact connectors may be secured to the output contact pads 26 and 28 for connecting the electrical leads.

The substrate 14 and the electrically conductive contacts 22 and 24 are preferably positioned in a clam-shell type housing 34. The housing 34 has a first housing member 36 having a base 38 and extending sidewalls 40 on opposing sides of the base. The housing member 36 has a rectangular portion 42 that receives the substrate 14 and a trapezoidal portion 44 extending from one end of the rectangular portion 42 that receives the electrically conductive contacts 22 and 24. The opposite end of the housing member 36 is open to receive a cable strain relief element 46. The strain relief element 46 has a jacket portion 48 with a bore there through that receives the electrical leads 30 and 32. Extending from either side of the bore at one end of the jacket 48 are outwardly extending lugs 50 with each lug 50 having an aperture 52 there through. The apertures 52 fit over upwardly extending studs 54 formed in the base 38 of the first housing member 36. In the embodiment shown, gaps are formed in the sidewalls 40 to allow a portion of each outwardly extending lug 50 to be exposed outside of the housing member 36. Additional upwardly projecting studs 56 are formed in the trapezoidal portion 44 of the housing member 36 to align the electrically conductive contacts 22 and 24 within the housing 34. A second housing member 58 having a periphery coextensive with the shape of the first housing member 36 is secured to the first housing member 36 to capture the substrate 14 and the electrically conductive contacts 22 and 24 in the housing 34. While the housing 34 has been described having a rectangular portion 42 and a trapezoidal portion 44, the housing 34 is not limited to this one configuration and other housing shapes or configurations may be used without departing from the scope of the present invention.

Figure 2:
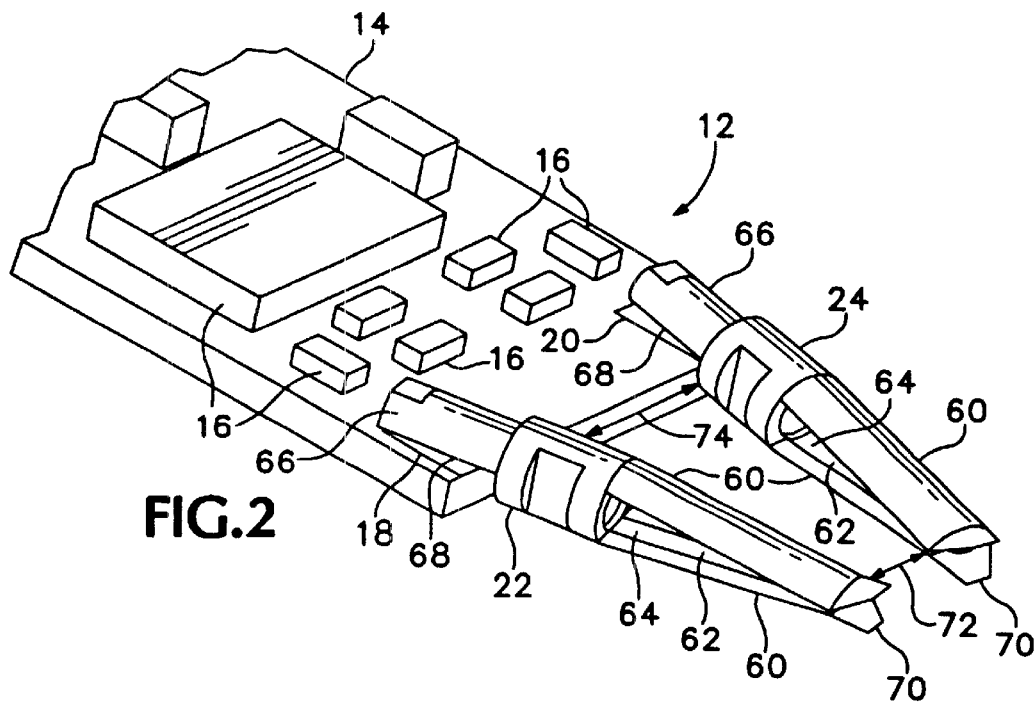
FIG. 2 is a enlarged perspective view of the low capacitance contact according to the present invention.

Referring to FIG. 2, there is shown an enlarged perspective view of the low capacitance probe contact 12. The electrically conductive contacts 22 and 24 each have fingers 60 with opposing interior flat surfaces 62 forming a slit 64 there between. The fingers 60 extend in a first direction with a mounting member 66 extending in the opposite direction. The mounting member 66 has a flat surface 68 formed thereon that is parallel to the flat surfaces 62 of the fingers. The flat surfaces 68 of the respective mounting members 66 are placed on the contact pads 18 and 20 and secured thereon by soldering or the like. In the preferred embodiment of the invention, the probe contacts 22 and 24 are inwardly angled such that the distal ends 70 of the fingers 60, as represented by arrowed line 72 are closer together than the mounting members 66, as represented by arrowed line 74, secured to the substrate 14. The distal ends 70 of the fingers 60 are angled outward to allow easy insertion onto pin contacts mounted on a circuit board under test.

The above describes probe contact 12 has significant advantages over previous probe contacts using barrels and injected molded plastic housings. First, the flat surfaces 68 of the mounting members 66 are aligned parallel with the slits 64 formed in the electrically conductive contacts 22 and 24. This configuration presents less metal cross-sectional area showing to the opposing contacts 22 and 24. Second, the contacts 22 and 24 are substantially separated by air, which has a dielectric constant of one; and is superior to injected molded plastic. Third, with the removal of the protective barrels around the contacts 22 and 24, the contacts 22 and 24 may be angled inward thus increasing the separation between the contacts. The angled contact configuration also allows the low capacitance probe contact 14 to be used on different sized pin contacts having different pitch geometries. Such pins sizes include 0.015 to 0.025 inch pins having pitch geometries including 0.080 to 0.100 inches.

The overall length of the probe is 1.135 inches with the rectangular portion having a length of 0.860 inches and the trapezoidal portion having a length of 0.275 inches. The width of the probe at the electrical lead end is 0.390 inches tapering to a width of 0.200 inches at the probe contact end. Openings between the respective sidewalls and the center stud 56 at the contact end are 0.100 inches to allow to probe to be placed on pin contacts having different pitch geometries. The housing members 36 and 58 are preferably injected molded plastic parts using ABS type plastic or the like. The substrate 14 is preferably formed of a ceramic material, such as alumina, having hybrid circuitry formed thereon. The electrically conductive contact are preferably formed of beryllium-copper and are manufactured using a CNC screw machine. The contacts are plated with a 50 micro-inch layer of gold over a 150 micro-inch layer of nickel. The contacts have an overall length of 0.330 inches and a diameter of 0.055 inches. The center-to-center spacing or pitch geometry at the distal ends 70 of the fingers 60 is nominally 0.080 inches with the mounting members 66 having a center-to-center spacing 0.240 inches.

Figure 3:
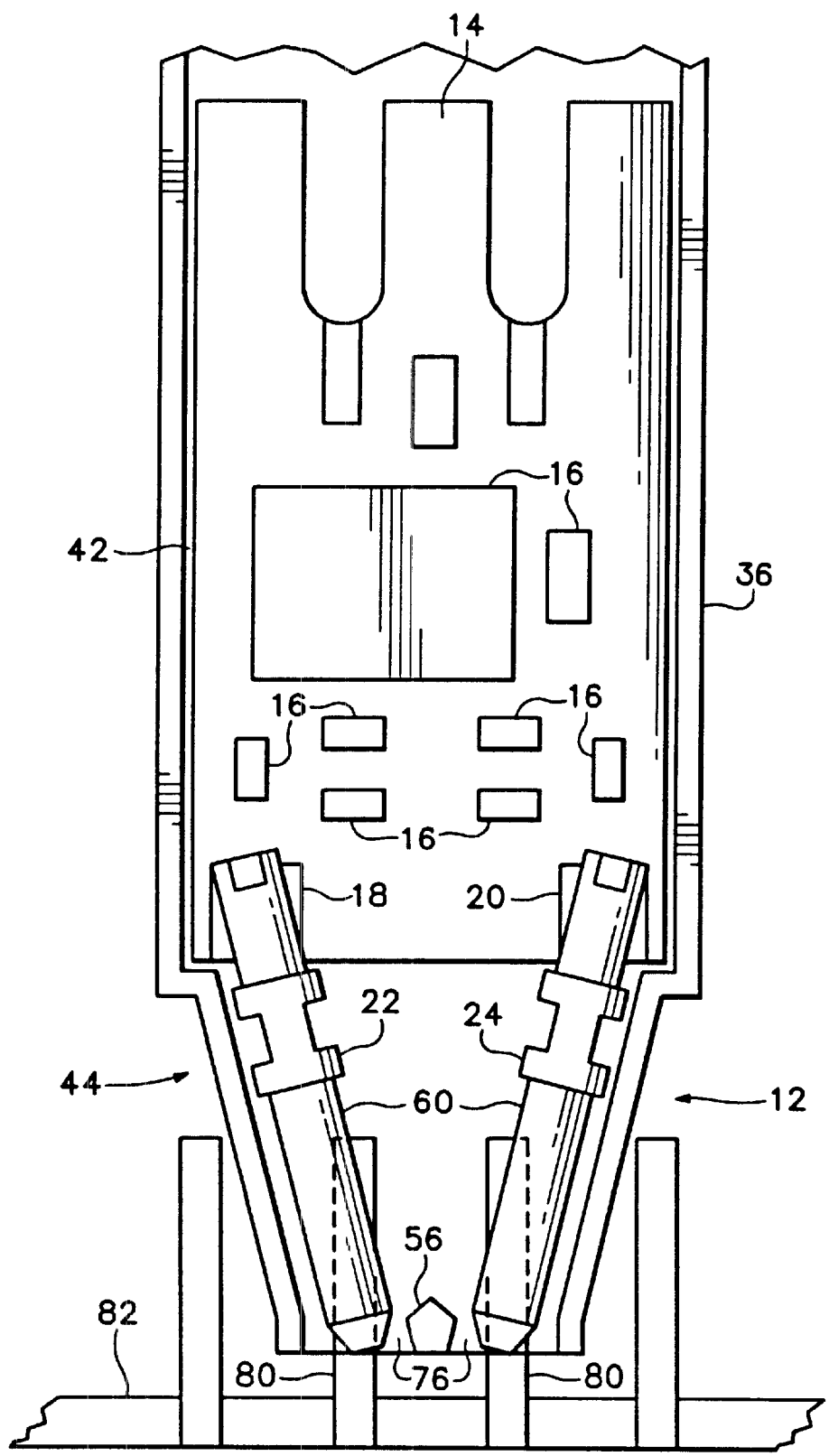
FIG. 3 is an exposed side view of the electrically conductive contacts in relation to pin contacts on a circuit board in the low capacitance probe contacts accordingly to the present invention.

Referring to FIG. 3, the is shown an exposed side view of the logic analyzer probe 10 with the low capacitance probe contact 12 in relation to pin contacts 80 on a circuit board 82. Like elements from the previous drawing figures are labeled the same. The 0.080 inch center-to-center spacing between the electrically conductive contacts 22 and 24 at the housing 34 opening allows placement on the pin contacts 80 having a corresponding center-to-center spacing. The opening 76 in the housing 34 are wider than the nominal center-to-center spacing of the contacts 22 and 24 to allow the probe 10 to be used with pin contacts 80 having different pitch geometries. It is envisioned that the low capacitance probe contact 12 can accommodate pin contacts 80 having a pitch geometry slightly greater than the distance between the sidewalls 40 through bending of the contacts 80. The probe 10 is vertically oriented in relation to the pin contacts 80 and placed on the contacts 80. Downward pressure of the probe 10 forces the pin contacts to angularly engage the fingers 60 of the electrically conductive contacts 22 and 24.

Figure 4:
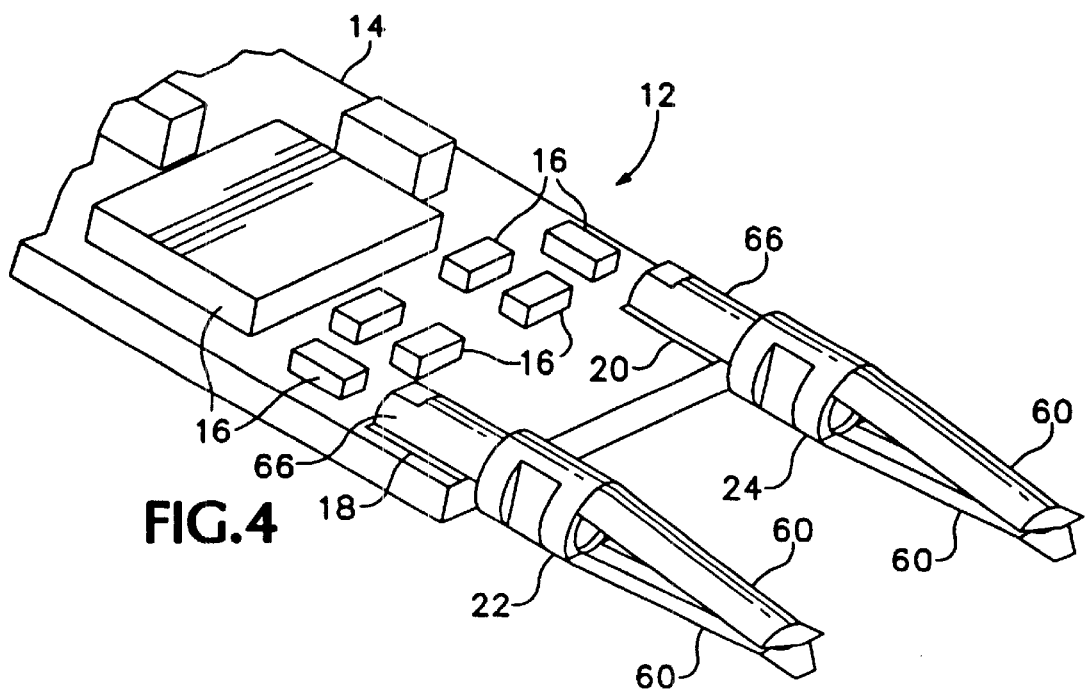
FIG. 4 is a perspective view of an alternative arrangement of the low capacitance contact according to the present invention.

Referring to FIG. 4, there is shown an alternative embodiment of the low capacitance probe contact 12 of the present invention. Like elements from the previous drawing figures are labeled the same. In the embodiment of FIG. 4, the electrically conductive contacts 22 and 24 are orientated parallel to each other as opposed to being inwardly angled. This further reduces the capacitance between the contacts 22 and 24 at the expense of the flexibility of accepting pin contacts 80 of varying pitch geometry. The spacing of the contact pads 18 and 20 may be varied to accommodate different pin contact 80 pitch geometries.

A low capacitance probe contact has been described for use in a logic analyzer probe that has electrically conductive contacts with gripping fingers extending in a first direction and a mounting member extending in the opposite direction. The fingers have interior flat surfaces forming a slit there between that is parallel with a flat mounting surface formed on the mounting member. The contacts are secured to pads formed on a substrate with the flat surface of the mounting member being soldered or the like to the pads. The contacts and the substrate are captured in a housing having a first member with base and sidewalls forming a recess that receives the contacts and substrate and a second member having a periphery coextensive with the first member that is affixed to the first member. Preferably, the contact are inwardly angled for accepting pin contacts having differing pitch geometries.

It will be obvious to those having skill in the art that many changes may be made to the details of the above-described embodiments of this invention without departing from the underlying principles thereof. The scope of the present invention should, therefore, be determined only by the following claims.

What is claimed is:

1. A low capacitance probe contact comprising:
   at least first and second electrically conductive contacts having fingers with opposing interior flat surfaces forming a slit there between extending in a first direction and a mounting member extending in the opposite direction having a flat surface that is parallel to the flat surfaces of the fingers;
   a substrate having first and second electrically conductive contact pads formed thereon on which are secured the first and second electrically conductive contacts with the flat surfaces of the mounting members being positioned on the contact pads; and
   a housing having first and second members with one of the members having a base and extending sidewalls forming a recess that receives the substrate and the first and second electrically conductive contacts with the other member having a periphery coextensive with the sidewalls that is secured to the sidewalls to capture the substrate and the first and second electrically conductive contacts within the housing.

2. The low capacitance probe contact as recited in claim 1 wherein the fingers have distal ends farthest from the mounting members with the first and second electrically conductive contacts being inwardly angled such that the distal ends of the fingers are closer together than the mounting members secured to the substrate.

3. The low capacitance probe contact as recited in claim 2 wherein the distal ends of the fingers are angled outward.

4. The low capacitance probe contact as recited in claim 1 further comprising a dielectric insulator disposed between the fingers of the first and second electrically conductive contacts having a dielectric constant equivalent to air.

5. A low capacitance probe contact comprising:
- at least first and second electrically conductive contacts having fingers extending in a first direction with opposing interior flat surfaces forming a slit there between and a mounting member extending in the opposite direction having a flat surface that is parallel to the flat surfaces of the fingers with the fingers having distal ends that are angled outward;
- a substrate having first and second electrically conductive contact pads formed thereon on which are secured the first and second electrically conductive contacts with the flat surfaces of the mounting members being positioned on the contact pads, the first and second electrically conductive contacts being inwardly angled such that the distal ends of the fingers are closer together than the mounting members secured to the substrate; and
- a housing having first and second members with one of the members having a base and extending sidewalls forming a recess that receives the substrate and the first and second electrically conductive contacts with the other member having a periphery coextensive with the sidewalls that is secured to the sidewalls to capture the substrate and the first and second electrically conductive contacts within the housing.

6. The low capacitance probe contact as recited in claim 5 further comprising a dielectric insulator disposed between the base and fingers of the first and second electrically conductive contacts having a dielectric constant equivalent to air.

7. A low capacitance probe contact for a logic analyzer comprising:
- at least first and second electrically conductive contacts having first and second fingers extending in a first direction with opposing interior flat surfaces forming a slit there between and a mounting member extending in the opposite direction having a flat surface that is parallel to the flat surfaces of the fingers with the fingers having distal ends that are angled outward;
- a substrate having first and second electrically conductive input pads on which are secured the first and second electrically conductive contacts with the flat surfaces of the mounting members being positioned on the input pads, the first and second electrically conductive contacts being inwardly angled such that the distal ends of the fingers are closer together than the mounting members secured to the substrate; and electrical circuitry disposed on the substrate for minimizing electrical loading of signals under test coupled to the first and second electrically conductive contacts;
- a housing having first and second members with one of the members having a base and extending sidewalls forming a recess that receives the substrate and the first and second electrically conductive contacts with a dielectric insulator disposed between the fingers of the first and second electrically conductive contacts having a dielectric constant equivalent to air with the other member having a periphery coextensive with the sidewalls that is secured to the sidewalls to capture the substrate and the first and second electrically conductive contacts within the housing; and
- electrical leads connected to output pads of the electrical circuitry and extending from the housing.

\* \* \* \* \*